(12) United States Patent
Kotani et al.

(10) Patent No.: US 8,373,177 B2
(45) Date of Patent: Feb. 12, 2013

(54) LIGHT EMITTING DIODE (LED) LIGHT SOURCE AND MANUFACTURING METHOD FOR THE SAME

(75) Inventors: Hiroshi Kotani, Tokyo (JP); Takahiko Nozaki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 315 days.

(21) Appl. No.: 12/903,200

(22) Filed: Oct. 12, 2010

(65) Prior Publication Data

US 2011/0084299 A1    Apr. 14, 2011

(30) Foreign Application Priority Data

Oct. 13, 2009   (JP) ................ 2009-236459

(51) Int. Cl.
*H01L 27/15* (2006.01)
*H01L 29/267* (2006.01)
*H01L 29/40* (2006.01)
*H01L 21/00* (2006.01)

(52) U.S. Cl. ............ 257/79; 257/81; 257/778; 257/784; 257/E21.627; 257/E21.641; 438/108; 438/617

(58) Field of Classification Search .............. 257/79, 257/81, 784, E21.627, E21.641, 778; 438/617, 438/108
See application file for complete search history.

(56) References Cited

U.S. PATENT DOCUMENTS

| 6,686,691 | B1 | 2/2004 | Mueller et al. |
| 6,855,958 | B2 | 2/2005 | Sato et al. |
| 7,520,647 | B2 | 4/2009 | Tachibana |
| 2003/0160255 | A1 | 8/2003 | Taninaka et al. |
| 2006/0197101 | A1 | 9/2006 | Wu |
| 2007/0247847 | A1 | 10/2007 | Villard |
| 2008/0303038 | A1 | 12/2008 | Grotsch et al. |
| 2009/0207583 | A1 | 8/2009 | Takano |
| 2009/0236613 | A1* | 9/2009 | Maruo et al. .............. 257/81 |
| 2011/0070729 | A1* | 3/2011 | Kurita .................... 438/617 |

FOREIGN PATENT DOCUMENTS

| JP | 2001-184910 A | 7/2001 |
| JP | 2002-60747 A | 2/2002 |
| JP | 2004-140090 A | 5/2004 |
| JP | 2005-32661 A | 2/2005 |
| JP | 2005-276805 A | 10/2005 |
| JP | 2007-329068 A | 12/2007 |
| JP | 2009-54633 A | 3/2009 |

* cited by examiner

*Primary Examiner* — Long Tran
(74) *Attorney, Agent, or Firm* — Kenealy Vaidya LLP

(57) ABSTRACT

An LED light source can include protection members to protect bonding wires. The LED can include a substrate including electrode patterns, a sub mount substrate located on the substrate, at least one flip LED chip mounted on the sub mount substrate and a phosphor rein covering the LED chip. The bonding wires can connect each of the electrode patterns to conductor patterns connecting to electrodes of the LED chip. The protection members can be located so as to surround both sides of the bonding wires. In addition, because each height of the protection members is higher than each maximum height of the bonding wires and is lower than a height of the phosphor resin, the protection members can protect the bonding wires from external pressure while the light flux is not reduced. Thus, the disclosed subject matter can provide a reliable LED light source having a favorable light distribution.

20 Claims, 14 Drawing Sheets

LIGHT EMITTING DIODE (LED) LIGHT SOURCE AND MANUFACTURING METHOD FOR THE SAME

This application claims the priority benefit under 35 U.S.C. §119 of Japanese Patent Application No. 2009-236459 filed on Oct. 13, 2009, which is hereby incorporated in its entirety by reference.

BACKGROUND

1. Field

The presently disclosed subject matter relates to an LED light source and a manufacturing method for the LED light source, and more particularly to a reliable LED light source that can provide a favorable light distribution for a vehicle headlight and the like and a method for manufacturing the LED light source.

2. Description of the Related Art

Recently, various LED chips have been used as a light source for—vehicle lamps resulting in improved brightness. When an LED light source using the LED chips is used for a vehicle headlight and the like, the LED light source is frequency constructed by mounting the LED chips on a circuit board so that the circuit board can be attached to a reflector and the like of the vehicle headlight.

Such an LED light source and a vehicle headlight using the LED light source are disclosed in patent document No. 1 (Japanese Patent Application Laid Open JP2005-32661). FIG. 13 is a conventional LED light source for a vehicle headlight, which is disclosed in patent document No. 1. The conventional LED light source includes: a circuit board 51; an LED chip 50 mounted on the circuit board 51; bonding wires 53 electrically connecting electrodes of the LED chip 50 to conductor patterns of the circuit board 51; and a reflector attached to the circuit board 51 so as to cover the LED chip 50.

Therefore, when providing the electrodes of the LED chip 50 with a power supply from an external battery via the conductor patterns of the circuit board 51, the conventional LED light source can illuminate light emitted from the LED chip 50 in a direction toward the arrow shown via the reflector 52. A heat sink may be located adjacent to the circuit board in order to radiate heat generated from the LED chip 50 away from the circuit board and the LED chip 50.

The LED chip 50 is frequency mounted on the circuit board 51 via a sub mount substrate due to various reasons such as an improvement of workability, an increase of the radiating efficiency, etc. FIG. 14 is a perspective view showing another conventional LED light source using the sub mount substrate, which is disclosed in patent document No. 1.

The other conventional LED light source includes: the circuit board 51; the LED chip 50 mounted on a sub mount substrate 61 that is mounted on the circuit board 51; metal blocks 62 mounted on the conductor patterns of the circuit board 51, the bonding wires 53 electrically connecting each of electrodes of the LED chip 50 to the respective metal blocks 62; and a protection element 63 such as a zener diode and the like connected between the metal blocks 62, that is, between the electrodes of the LED chip 50.

In the above-described conventional LED light sources, the bonding wires 53 are not protected from external pressure. Accordingly, in manufacturing processes that occur after the wire bonding process (e.g. a process for attaching the reflector 52 to the circuit board 51 including the bonding wires 53), problems such as the bonding wires 53 disconnecting or shorting may be caused by the external pressure.

As a first countermeasure for the above-described problems, a structure in which an encapsulating resin encapsulates the LED chip including the bonding wires therewith is disclosed in patent document No. 2 (Japanese Patent Application Laid Open JP2007-329068), etc. As a second countermeasure, a structure in which a dome-shaped transparent lens covers the LED chip including the bonding wires along with the circuit board is disclosed in patent document No. 3 (Japanese Patent Application Laid Open JP2009-054633), etc.

The above-referenced Patent Documents are listed below and are hereby incorporated with their English abstract in their entirety.

1. Patent document No. 1: Japanese Patent Application Laid Open JP2005-32661
2. Patent document No. 2: Japanese Patent Application Laid Open JP2007-329068 (U.S. patent application Ser. No. 11/759,482)
3. Patent document No. 3: Japanese Patent Application Laid Open JP2009-054633 (U.S. patent application Ser. No. 12/198,098)

However, in a structure including an encapsulating resin, the encapsulating resin may alternate between expansion and a contraction due to a heat cycle, which is caused by alternating on and off states of the LED chip. The thermal stress of the expanse and the contraction may cause problems such that the bonding wires weaken.

In addition, in the structure including the dome-shaped transparent lens, a part of light emitted from the LED chip may be absorbed by the dome-shaped transparent lens. Accordingly, the transparent lens may cause a reduction in light use efficiency of the LED light source.

The disclosed subject matter has been devised to consider the above and other problems, characteristics and features. Thus, an embodiment of the disclosed subject matter can include a reliable LED light source in which bonding wires can be protected from external pressure. In this case, the bonding wires can be protected by a structure that does not include an encapsulating resin and a dome-shaped lens while the number of the bonding wires is reduced by using a flip type LED chip even if the number of the LED chips increases. Thus, the LED light source can result in high reliability and a favorable light distribution, and therefore can be employed for various lighting units such as a vehicle headlight, general lighting, etc.

SUMMARY

The presently disclosed subject matter has been devised in view of the above and other characteristics, desires, and problems in the conventional art. An aspect of the disclosed subject matter can include providing reliable LED light sources for various light units such as a vehicle headlight, in which bonding wires can be protected from an external pressure while the number of the bonding wire is reduced and high light use efficiency remains. Another aspect of the disclosed subject matter can include providing methods for manufacturing reliable LED light sources having a favorable light distribution.

According to one aspect of the disclosed subject matter, an LED light source can include: a substrate including electrode patterns that is exposed from the substrate; a sub mount substrate located on the substrate and adjacent to the electrode patterns of the substrate, and the sub mount substrate including a plurality of conductor patterns on an opposite surface of the substrate; at least one flip type LED chip having bottom electrodes mounted on the conductor patterns of the sub mount substrate while each of the bottom electrodes is electrically connected to each of the conductor patterns; a phosphor resin covering the at least one flip type LED chip; first bonding wires being electrically connected between each of the electrode patterns of the substrate and the respective conductor patterns that are located adjacent to each of the electrode patterns; and first protection members. The first protection members can be located along each of extending directions of the first bonding wires so as to surround at least both sides of each extending direction of the first bonding wires, wherein each height of the first protection members is higher than each maximum height of the first bonding wires and is lower than a height of the phosphor resin.

According to another aspect of the disclosed subject matter, the LED light source can include at least one LED chip having a top electrode and a bottom electrode in place of the at least one flip type LED chip. In this case, the at least one LED chip can be mounted on one of the conductor patterns of the sub mount substrate using the bottom electrode while the bottom electrode is electrically connected to the one of the conductor patterns, and the top electrode can be electrically connected to another of the conductor patterns via a second bonding wire. In addition, at least one second protection member can be located along an extending direction of the second bonding wire so as to surround at least both sides of the extending direction of the second bonding wire, wherein the height of the at least one second protection member is higher than a maximum height of the second bonding wire and is lower than the height of the phosphor resin.

In the above-described exemplary LED light sources, the substrate can include a cavity having a substantially flat bottom surface and the sub mount substrate can be mounted on the bottom surface of the substrate. Each of the first protection members and the at least one second protection member can include one of a silicon resin, an epoxy resin and a ceramic. Each of the first protection members can be formed in a substantially rectangular shape from a front view and the at least one second protection member can be formed in a substantially U-shape from the front view. Moreover, the at least one LED chip can be a blue LED chip and the phosphor resin can include a yellow phosphor to emit white light from the LED light source.

According to the above-described exemplary LED optical units, each height of the first and second protection members can be higher than each maximum height of the first and second bonding wires and can be lower than the height of the phosphor resin. Thus, the first and second protection members can protect the first and second bonding wires from external pressure while a reduction of light flux is prevented and/or does not occur and the first and second bonding wires do not weaken unlike a conventional structure having a dome shaped lens including an encapsulating resin.

According to another aspect of the disclosed subject matter, a manufacturing method for an LED light source according to one embodiment can include: preparing the substrate including the electrode patterns, the sub mount substrate including the plurality of conductor patterns and the at least one LED chip having the top electrode and the bottom electrode; mounting the at least one LED chip on the one of the conductor patterns of the sub mount substrate using the bottom electrode of the at least one LED chip; bonding between the top electrode of the at least one LED chip and the other one of the conductor patterns of the sub mount substrate via the second bonding wire; forming the at least one second protection member so as to surround the at least both sides of the extending direction of the second bonding wire; mounting the sub mount substrate on the substrate; bonding between the one of the conductor patterns of the sub mount substrate and the one of the electrode patterns of the substrate and between the other one of the conductor patterns of the sub mount substrate and the other one of the electrode patterns of the substrate via the first bonding wires; and forming the first protection members so as to surround the at least both sides of each extending direction of the bonding wires.

In this case, a manufacturing method for the LED light source can eliminate the bonding process for the second bonding wire and the forming process for the second protection member by replacing the at least one LED chip with the at least one flip type LED chip. Thus, the above-described manufacturing methods can provide reliable LED light sources having a favorable light distribution, which can be used for various lighting units such as a vehicle headlight, general lighting, etc.

BRIEF DESCRIPTION OF THE DRAWINGS

These and other characteristics and features of the disclosed subject matter will become clear from the following description with reference to the accompanying drawings, wherein:

FIG. 2 is a close-up view depicting a first protection member of the first embodiment shown in FIG. 1a;

FIG. 7 is a close-up view depicting a first protection member of the variation of the first embodiment shown in FIG. 6a;

FIG. 9b is a cross-section view showing a cross-section taken along line A-A of the second embodiment shown in FIG. 9a;

FIG. 10a is a close-up view depicting a second protection member of the second embodiment shown in FIG. 9a, and FIG. 10b is a cross-sectional view showing a cross-section taken along line D-D of the second protection member shown FIG. 10a;

FIG. 11b is a cross-section view showing a cross-section taken along line A-A of the third embodiment shown in FIG. 11a;

FIG. 13 is a cross-section view showing a conventional LED light source for a vehicle headlight; and.

DETAILED DESCRIPTION OF EXEMPLARY EMBODIMENTS

Figure 1A:
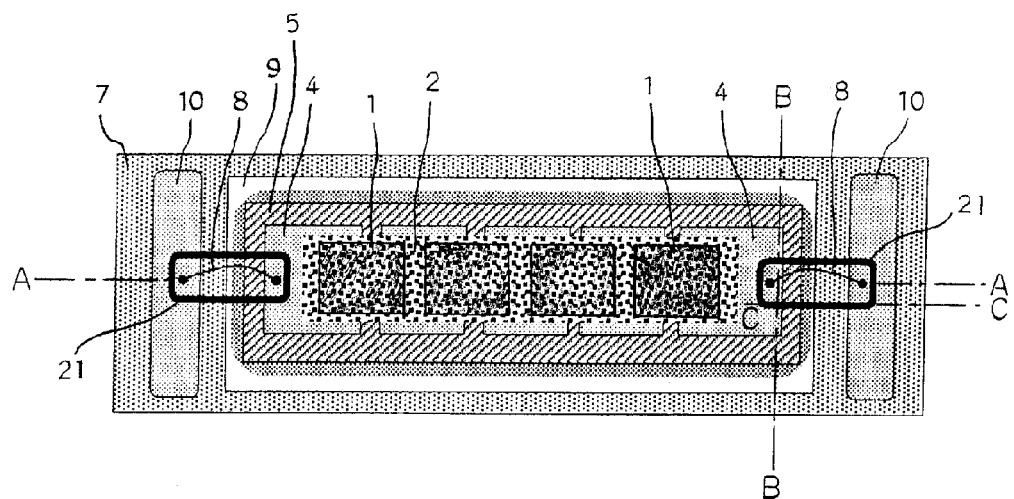
FIG. 1a is a front view showing a first exemplary embodiment of an LED light source made in accordance with principles of the disclosed subject matter.
Figure 1B:
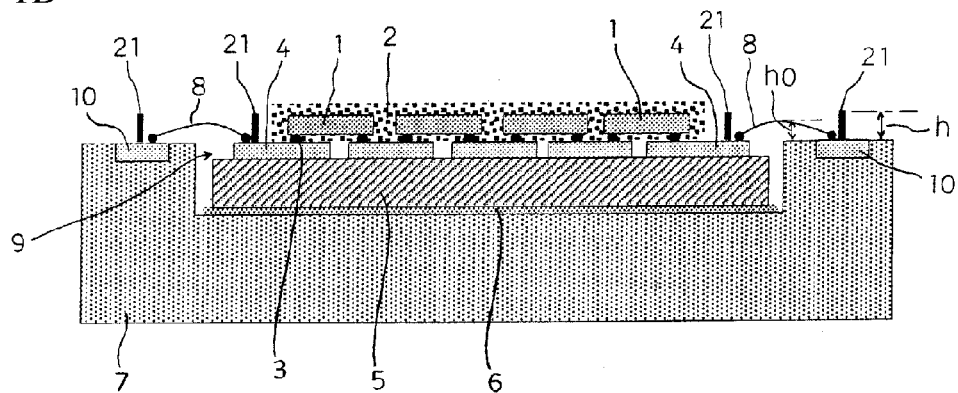
FIGS. 1b and 1c are cross-section views showing cross-sections taken along line A-A and line B-B of the first embodiment shown in FIG. 1a, respectively.
Figure 1C:
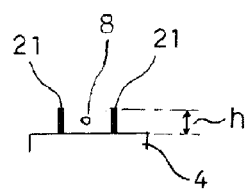

The disclosed subject matter will now be described in detail with reference to FIGS. 1 to 12, in which the same or corresponding elements use the same reference marks. FIG. 1 is a front view showing a first exemplary embodiment of an LED light source made in accordance with principles of the disclosed subject matter. FIGS. 1b and 1c are cross-sectional views showing cross-sections taken along line A-A and line B-B of the first embodiment shown in FIG. 1a, respectively.

The LED light source can include: a substrate 7 made by a metallic board and including a cavity 9 in which a bottom surface is flat; a sub mount substrate 5 made by an insulating board and mounted on the substrate 7 via an adhesive material 6; electrode patterns 10 formed in the substrate 7 so as to be exposed from the substrate 7 for receiving a power supply while they are isolated from the substrate 7; a plurality of conductor patterns 4 formed on the sub mount substrate 5; a plurality of flip type LED chips 1 (e.g., flip type LED chips) located at each prescribed position of the plurality of conductor patterns 4 via bumps 3; and first bonding wires 8 electrically connecting each of the electrode patterns 10 to the respective conductor patterns 4 that are located adjacent to each of the electrode patterns 10.

The plurality of LED chips 1 can be covered with a phosphor resin 2, which is made by mixing a phosphor with a transparent resin such as an epoxy resin, a silicone resin, etc. When the LED light source is used as a light source for a vehicle headlight, the LED light source can emit white light by an additive color mixture. For example, the white light can be emitted by composing the plurality of LED chips 1 of a blue LED chip and by composing the phosphor of a yellow phosphor such as YAG (yttrium aluminum garnet), etc.

In addition, each top surface of the electrode patterns 10 and a top surface of the substrate 7 can be formed in the substantially same level, and each top surface of the electrode patterns 10 and the substrate 7 and each top surface of the conductor patterns 4 can also be formed in the substantially same level. In the case, the top surface of the substrate 7 and a top surface of the sub mount substrate 5 are formed in the substantially same level, and each top surface of the electrode patterns 10 and each top surface of the conductor patterns 4 can also be formed in the substantially same level by forming the electrode patterns 10 on the top surface of the substrate 7.

As the first bonding wires 8, a gold-bonding wire having a diameter of 20 to 30 micrometer can be used. A maximum height h0 of the first bonding wires 8 can be lower than a height of the phosphor resin 2. The maximum height h0 of the first bonding wires 8 shown in FIG. 1b is approximately 200 micrometers with reference to the top surface of the substrate 7, which is the same level as the top surface of the electrode pattern 10. The first bonding wires 8 may cross a groove, which is naturally formed between the substrate 7 and the sub mount substrate 5.

Figure 2:
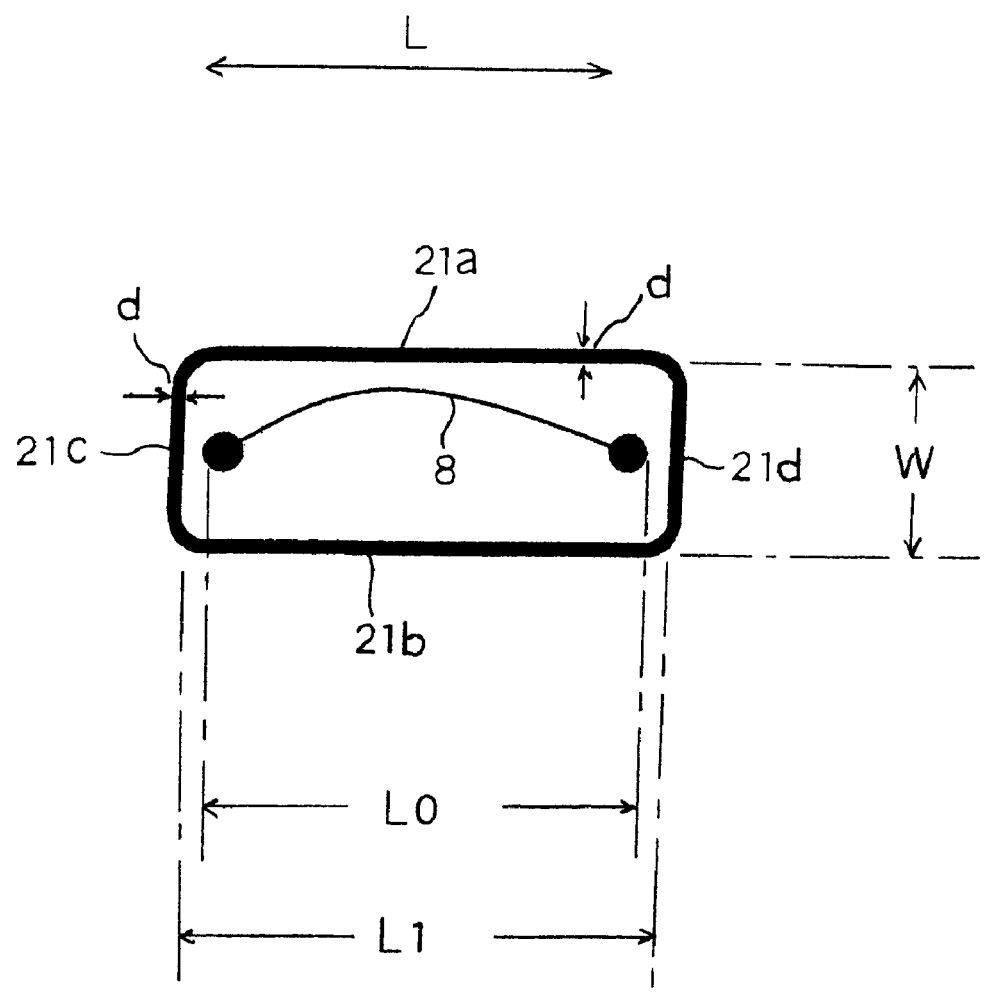

The above-described LED light source can be provided with a first protection member 21 for protecting the first bonding wires 8 from an external pressure. FIG. 2 is a close-up view depicting the first protection member 21 in the first embodiment shown in FIG. 1a. The first protection member 21 can be formed in a substantially rectangular shape so as to surround the first bonding wire. That is, the first protection member 21 can include longitudinal portions 21a and 21b, which are located in an extending direction L of the first bonding wire, and short portions 21c and 21d, which are located in a direction perpendicular to the extending direction L of the first bonding wire.

Here, each length L1 of the longitudinal portions 21a and 21b can be approximately 100 micrometers longer than a wiring length L0 of the first bonding wire, which connects between the electrode pattern 10 and the conductor pattern 4 that is located adjacent to the electrode pattern 10. A width between the longitudinal portions 21a and 21b, that is, each length W of the short portions 21c and 21d can be approximately 500 micrometers.

In the case, the first bonding wire cannot contact the first protection member 21 even when the first bonding wire shakes because the maximum height h0 of the first bonding wires 8 is approximately 200 micrometers. In addition, because the width between the longitudinal portions 21a and 21b is very narrow, the first protection member 21 can provide—high pressure resistance, which is similar to a dome-shaped protection member even when a top surface of the first protection member 21 is open. Here, a reference mark "d" shown in FIG. 2 shows a wiring width of the first protection member 21.

Figure 3:
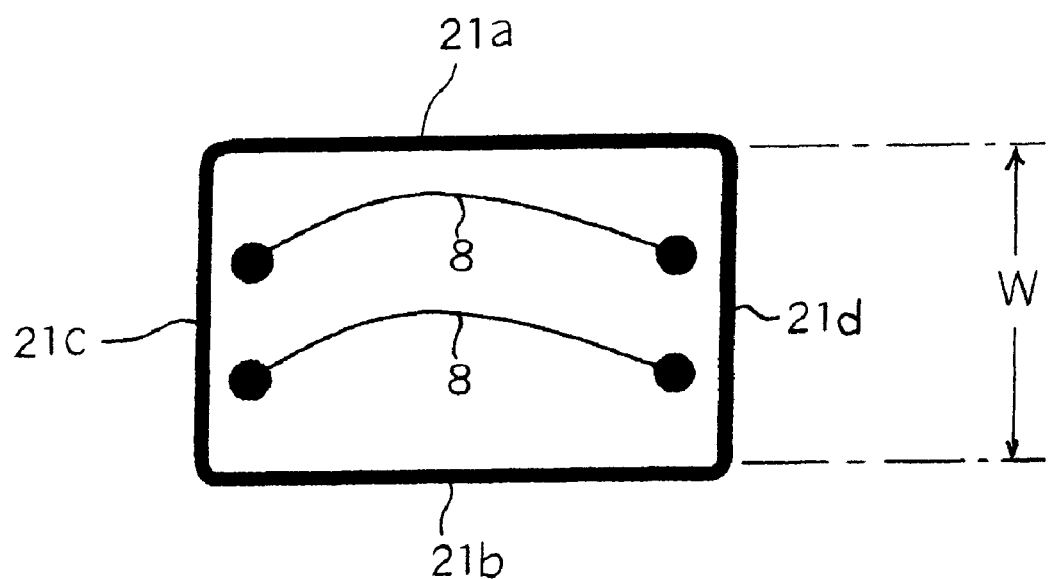
FIG. 3 is a close-up view depicting a first protection member in which two bonding wires are located in parallel in the first protection member shown in FIG. 2.

FIG. 3 is a close-up view depicting the first protection member 21 when two bonding wires 8 are located in parallel. The width between the longitudinal portions 21a and 21b, that is, each length W of the short portions 21c and 21d can be approximately 600 micrometers when a space between the two bonding wires 8 is approximately 100 micrometers.

A height h of the first protection member 21 with reference to the top surface of the substrate 7 that is the same level as the top surface of the electrode pattern 10 can be higher than the maximum height h0 of the first bonding wire to protect the first bonding wire from the external pressure. The height h of the first protection member 21 can be lower than that of the phosphor resin 2.

In the first embodiment shown in FIG. 1b, the top surface of the electrode pattern 10 is the substantially the same level as the top surface of the conductor pattern 4, which is located adjacent to the electrode pattern 10. Consequently, a height from the conductor pattern 4 of the first protection member 21 that is located on the conductor pattern 4 can be the substantially the same as the height h from the top surface of the substrate 7 of the first protection member 21, which is located on the electrode pattern 10.

When the height h of the first protection member 21 is lower than that of the phosphor resin 2, a decrease of a flux of light emitted from the LED chips 1 that may be caused by the first protection member 21 may be prevented. In this case, when the level of the top surface of the electrode pattern 10 is different from that of the top surface of the conductor pattern 4, if the height from the conductor pattern 4 of the first protection member 21 that is located on the conductor pattern 4 is the substantially same as the height h from the substrate 7 of the first protection member 21 that is located on the electrode pattern 10, a differential height between the first protection member 21 that are located on the conductor pattern 4 and the electrode pattern 10 may occur.

However, as described later, even when the top surface of the electrode pattern 10 is not the same level as the top surface of the conductor pattern 4, the height h of the first protection member 21 can be maintained at the substantially same level so as not cause the differential in height. The height h of the first protection member 21 can vary in accordance with a shape of the first bonding wire, for example, the height from the substrate 7 of the first protection member 21 that is located on the electrode pattern 10 can become higher than the height from the conductor pattern 4 of the first protection member 21 that is located on the conductor pattern 4 so that the first bonding wire 8 can be protected from the external pressure in the following manufacturing processes.

When the height h of the first protection member 21 is higher than the maximum height h0 of the first bonding wire and the length of the short portions 21c and 21d of the first protection member 21 is approximately 500 micrometers, the first bonding wire can be protected from the external pressure by the first protection member 21. Even if the first bonding wire is pressed by the external pressure, the first bonding wire may be pressed only toward the groove, and therefore may not come down.

As the first protection member 21, a resin such as a transparent silicone resin, a transparent epoxy resin and the like can be used. A white resin can be used in place of the transparent resin. For example, a white resin that is mixed with a filler such as titanium oxide and the like with the transparent epoxy resin or the transparent silicone resin at a rate of 5 to 20 weight percentage can be used as the first protection member 21.

In these cases, when the LED light source emits an upward light that may give a glaring type light to an oncoming car and the like due to the first protection member 21, which is made of the transparent resin or the white resin, the amount of upward light may be reduced by using a black resin. A black resin that is a mix of a filler such as carbon and the like with a transparent epoxy resin or a transparent silicone resin can be used as the first protection member 21.

A ceramic ring can also be used as the first protection member 21 in place of the above-described resins. When the ceramic ring is used as the first protection member 21, the ceramic ring can be attached to the electrode pattern 10, the substrate 7 and the conductor pattern 4 of the sub mount substrate 5 via an adhesive material such as a silicon resin, an epoxy resin, etc.

A manufacturing method for the first protection member 21 of the LED light source will now be described in detail. After preparing the sub mount substrate 5 including the plurality of LED chips 4 and the substrate 7, the sub mount substrate 5 is mounted on the substrate 7 via the adhesive material 6, and each of the electrode patterns 10 of the substrate 7 is electrically connected to the respective conductor patterns 4 that are located adjacent to each of the electrode patterns 10 via the first bonding wires 8.

Figure 4:
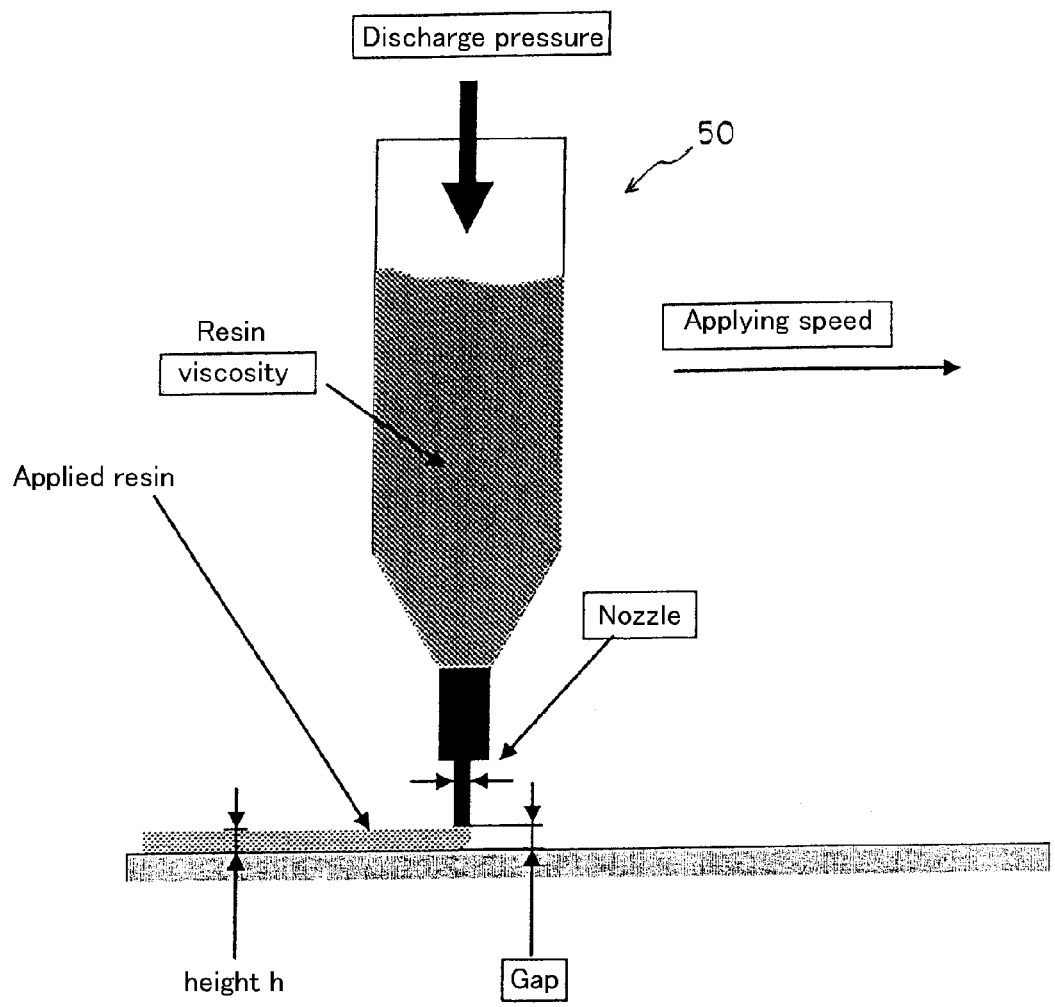
FIG. 4. is an explanatory diagram of a manufacturing process for the first protection member by a dispenser.

FIG. 4 is an explanatory diagram of a manufacturing process for the first protection member 21 by a dispenser. A transparent resin (e.g. a silicone having a viscosity of 50 Pa·s) is poured in the dispenser (e.g. dispenser made by Musashi engineering Co., Ltd.). A nozzle of the dispenser can move at a prescribed applying speed from the substrate 1 toward the conductor pattern 4 of the sub mount substrate 5 while it disposes the resin at the predetermined wiring wide d and the height h on the substrate 7, the electrode pattern 10 of the substrate 7 and the conductor pattern 4 of the sub mount substrate 5.

More specifically, when a diameter of the nozzle is 0.3 millimeters, the applying speed can be 5 millimeters/second, a discharge pressure can be 50 KPa, and a gap between the nozzle and an applying surface can be 0.2 millimeters, the first protection member 21 having the wiring width d of 0.5 millimeters and the height h of 0.2 millimeters that is the same as the maximum height h0 of the first bonding wire can be applied on the electrode pattern 10, the substrate 7 and the conductor pattern 4 of the sub mount substrate 5. After that, the first protection member 21 can be solidified for over four hours at 150 degrees centigrade.

In the above-described manufacturing method, the wiring width d of the first protection member 21 can be adjusted by changing the diameter of the nozzle of the dispenser 50, the applying speed, the discharge pressure, the gap and the viscosity of the resin. When the applying speed increases, the wiring width d of the first protection member 21 can become narrow. When the discharge pressure decreases and when the gap between the nozzle and the applying surface is reduced, the wiring width d of the first protection member 21 can become narrow. The wiring width d can be adjusted within the range of 40 micrometers to 3 millimeters.

In the above-described manufacturing method, a corner wiring width of the first protection member 21 may become slightly wide as compared with other portions. However, there is no problem with the function of the first protection member 21 to protect the first bonding wire 8. However, when the corner wiring width of the first protection member 21 is formed in the same as the other portions, the corner wiring width can be reduced by increasing the applying speed.

The height h of the first protection member 21 can be adjusted by changing the applying speed of the dispenser 50, the discharge pressure, the gap between the nozzle and the applying surface and the viscosity of the resin. For example, when the applying speed decreases, the height h of the first protection member 21 can become higher. When the applying speed increases, the height h of the first protection member 21 can become lower.

When the discharge pressure increase, the height h can become higher, and when the discharge pressure decreases, the height h can become lower. In addition, when the gap between the nozzle and the applying surface increases, the height h of the first protection member 21 can become higher. In contrast, when the gap decreases, the height h can become lower.

In this case, when the height h of the first protection member 21 is shorter than the wiring width d of the first protection member 21, the height h can be adjusted by changing the applying speed, the discharge pressure and the gap. However, when the height h is longer than the wiring width d, it may be difficult to apply the resin to the electrode pattern 10 of the substrate 7, the conductor pattern of the sub mount substrate 5, etc at a same time. Accordingly, when the height h is longer than the wiring width d, the resin can be applied by a multi-layer structure. Although the height h of the first protection member 21 may become higher by the multi-layer structure, the decrease of the light flux is not caused if the height h of the first protection member 21 is lower than the height of the phosphor resin 2.

In the above-described manufacturing method, a corner height of the first protection member 21 may become slightly higher as compared with the other portions. However, if the corner height is lower than the height of the phosphor resin 2, the decrease of the light flux cannot be caused. When the corner height of the first protection member 21 is formed in the same as the other portions, the corner height can be adjusted by increasing the applying speed at the corner.

The height h of the first protection member 21 can be adjusted within the range of 40 micrometers to 3 millimeters. In the above-described exemplary embodiment, the height h should be adjusted between 0.2 to 0.5 millimeters because the maximum height h0 of the first bonding wire 8 is approximately 0.2 millimeters. The wiring width d of the first protection member 21 can narrow by the resin having a slightly high viscosity, and thereby a glaring type light caused by reflection on the first protection member 21 can be extremely reduced.

Figure 5A:
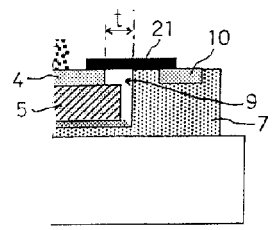
FIG. 5a is a cross-sectional side view of the first embodiment taken along line C-C of FIG. 1a, FIGS. 5b and 5c are cross-sectional side views of a second exemplary groove in which the width t of a groove is wide.

FIG. 5a is a cross-section side view of the first embodiment taken along line C-C of FIG. 1a. When a width t of the groove between the substrate 7 and the sub mount substrate 5 is narrow as shown in FIG. 5a, the first protection member 21 cannot hollow because of the narrow groove but it can be formed in the substantially same level with reference to the top surface of the substrate 7.

Figure 5B:
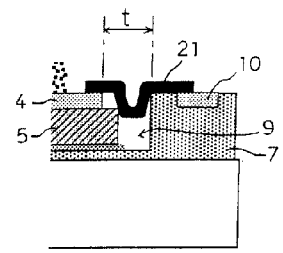
FIGS. 5d and 5e are cross-sectional side views of a third exemplary groove in which the width t of the groove is wide and a conductor pattern is located at a higher position than a substrate.
Figure 5C:
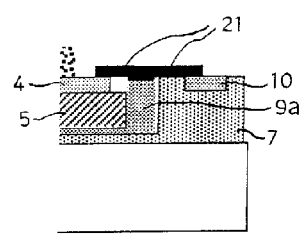

FIG. 5b is a cross-section side view of a second exemplary groove in which the width t of the groove is wide. When the width t of the groove is wide as shown in FIG. 5b, the first protection member 21 may hollow due to the wide groove, and therefore a part of the first protection member 21 may not be formed in the same level with reference to the top surface of the substrate 7. In this case, the first protection member 21 can be formed in the substantially same level with reference to the top surface of the substrate 7 without the hollow by filling the wide groove with a patching resin 9a as shown in FIG. 5c.

The patching resin 9a can be the same as the resin of the first protection member 21, and the patching resin 9a can be filled in the groove by stopping a movement of the nozzle of the dispenser 50 until the groove is filled with the patching resin 9a or by extremely decreasing the applying speed so as to fill the groove with the patching resin 9a. When the patching resin 9a is filled in the groove, the patching resin 9a does not cause a functional degradation such as the decrease of the light flux because the patching resin 9a is located between the substrate 7 and the sub mount substrate 5. After the groove is filled with the patching resin 9a, the first protection member 21 can be formed without the hollow as shown in FIG. 5c by applying the resin on the applying condition of the FIG. 5a.

Figure 5D:
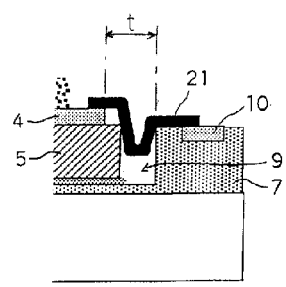

FIG. 5d is a cross-section side view of a third exemplary groove in which the width t of the groove is wide and the conductor pattern 4 of the sub mount substrate 5 is located at a higher position than the substrate 7 including the electrode pattern 10. The first protection member 21 may hollow between the sub mount substrate 5 and the substrate 7 because of the wide groove. In addition, the first protection member 21 located on the conductor pattern 4 may be formed in a higher position than the first protection member 21 which is located on the substrate 7 and the electrode pattern 10.

Figure 5E:
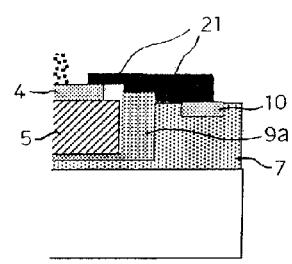

In this case, the first protection member 21 can be formed in the substantially same level with reference to the top surface of the substrate 7 without the hollow by filling the wide groove with the patching resin 9a as shown in FIG. 5e. More specifically, the patching resin 9a is filled at a middle position of the top surfaces of the conductor pattern 4 and the substrate 7 in the groove, and the first protection member 21 can be formed in the substantially same level by applying the resin in thicker shapes in order of the substrate 7 including the electrode pattern 10, the patching resin 9a and the conductor pattern 4.

In the above-described embodiment, when the width t of the groove is narrow and the top surface of the conductor pattern 4 is higher than the top surface of the substrate 7, the first protection member 21 can be formed at the substantially same level without the patching resin 9a by applying the resin in thicker shapes in order of the substrate 7 including the electrode pattern 10, the patching resin 9a and the conductor pattern 4.

Figure 6A:
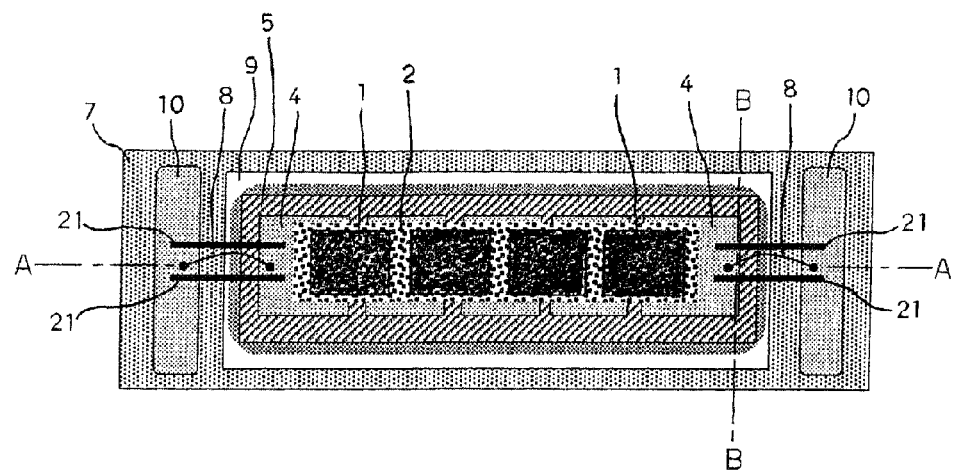
FIG. 6a is a front view showing a variation of the first embodiment shown in FIG. 1a, and FIGS. 6b and 6c are cross-sectional views showing cross-sections taken along line A-A and line B-B of the variation shown in FIG. 6a, respectively.
Figure 6B:
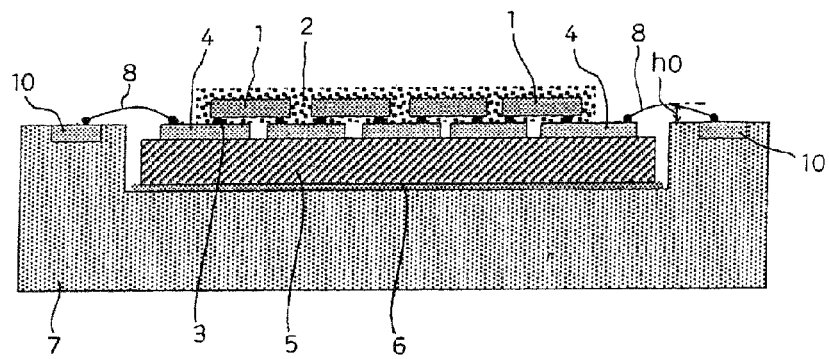
Figure 6C:
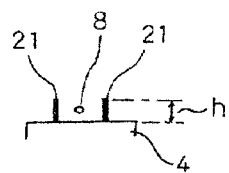

FIG. 6a is a front view showing a variation of the first embodiment shown in FIG. 1a, and FIGS. 6b and 6c are cross-sectional views showing cross-sections taken along line A-A and line B-B of the variation shown in FIG. 6a, respectively. A difference between the embodiment of FIG. 1a and the variation of FIG. 6a relates to the structure of the first protection member 21. The other structures of FIG. 6a can be the same as the structure of the embodiment shown in FIG. 1a.

Figure 7:
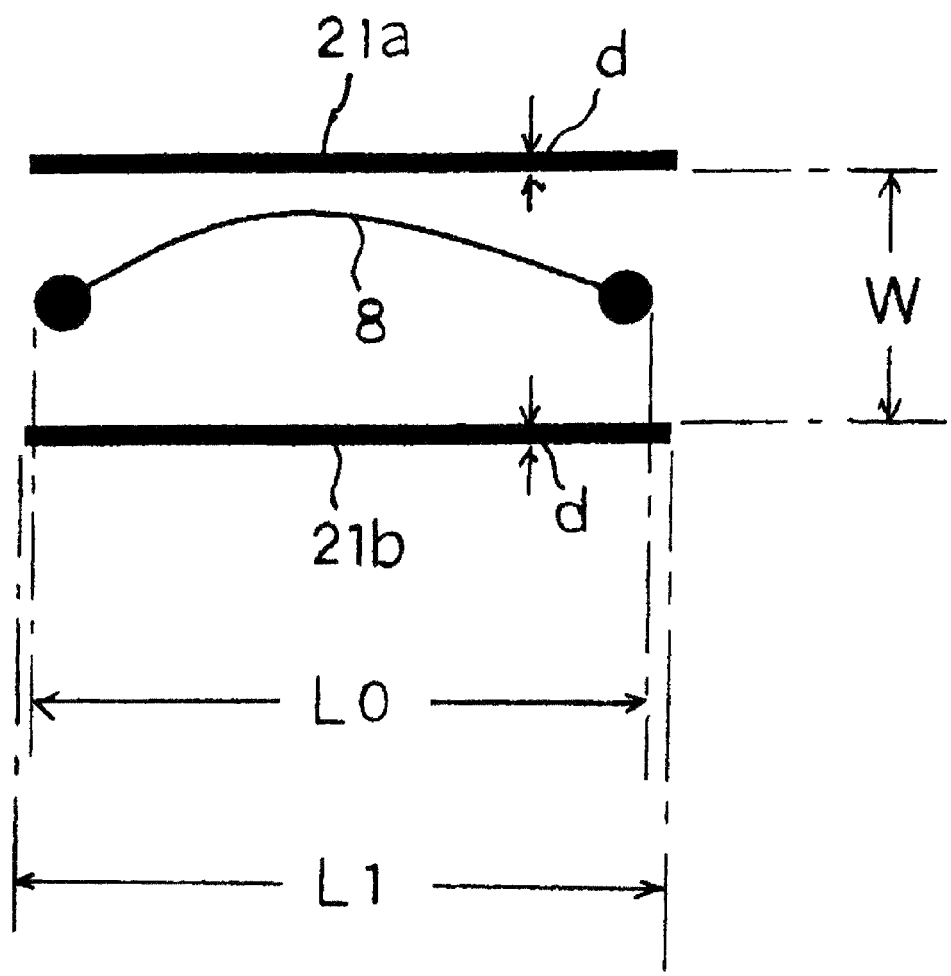

FIG. 7 is a close-up view depicting a first protection member of the variation of the first embodiment shown in FIG. 6a. The first protection member 21 may include the longitudinal portions 21a and 21b, and does not include the short portions 21c and 21d shown in the embodiment of FIG. 2. Each length L1 of the longitudinal portions 21a and 21b can be approximately 100 micrometers longer than a wiring length L0 of the first bonding wire 8, which connects between the electrode pattern 10 and the conductor pattern 4 that is located adjacent to the electrode pattern 10. A width W between the longitudinal portions 21a and 21b can be approximately 500 micrometers.

In this case, the first bonding wire 8 cannot contact with the first protection member 21 even when the first bonding wire 8 shakes because the maximum height h0 of the first bonding wires 8 is approximately 200 micrometers. In addition, because the width W between the longitudinal portions 21a and 21b is very narrow, the first protection member 21 can provide a high pressure resistance, which is almost similar to a dome-shaped protection member even when the first protection member 21 does not include the short portions 21c, 21d and the top surface.

Figure 8:
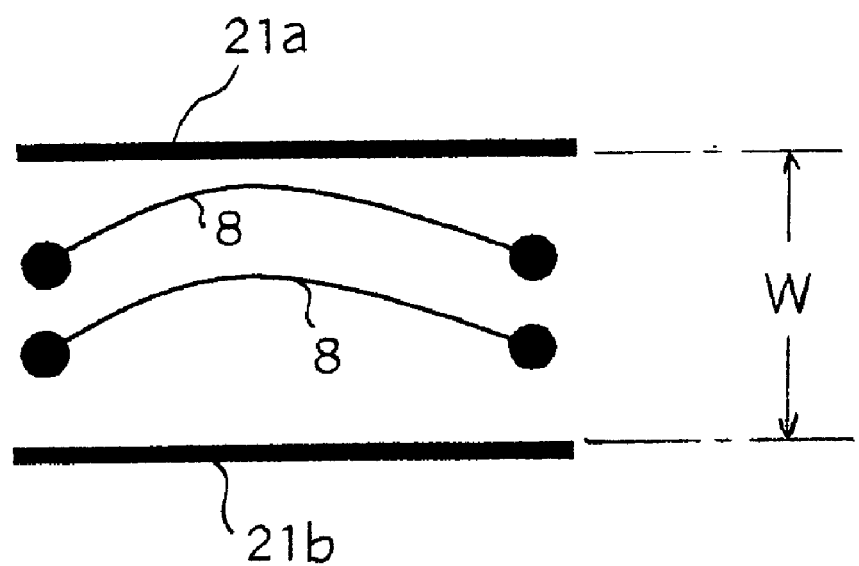
FIG. 8 is a close-up view depicting a first protection member in which two bonding wires are located in parallel in the first protection member shown in FIG. 7.

FIG. 8 is a close-up view depicting a first protection member in which two bonding wires are located in parallel in the first protection member shown in FIG. 7. The width W between the longitudinal portions 21a and 21b can be approximately 600 micrometers for the reason described with respect to FIG. 7 when a space between the two bonding wires 8 is approximately 100 micrometers.

In FIGS. 6a to 6c, because the height h of the first protection member 21 can be higher than the maximum height h0 of the first bonding wire 8 and the length of the short portions 21c and 21d of the first protection member 21 can be approximately 500 micrometers, the first bonding wire 8 can be protected from the external pressure by the first protection member 21. Even if the first bonding wire 8 is pressed by the external pressure, the first bonding wire 8 may be pressed only toward the groove, and thus may not come down.

Figure 9A:
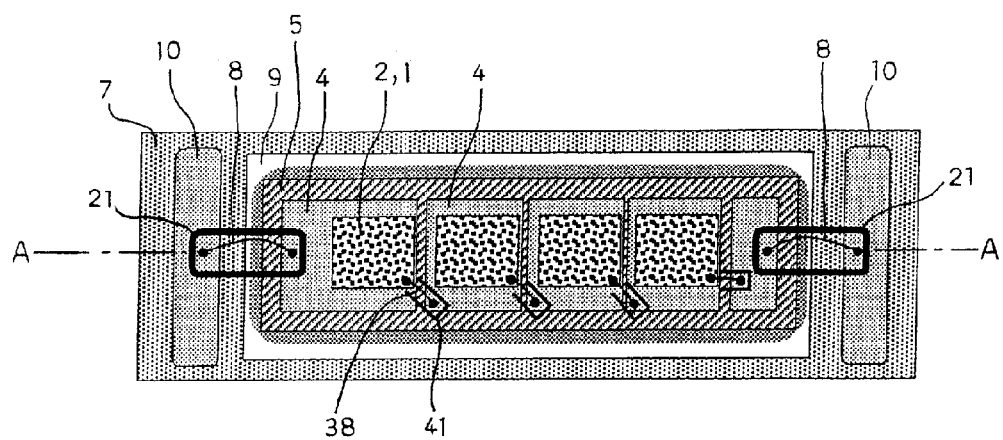
FIG. 9a is a front view showing a second exemplary embodiment of an LED light source made in accordance with principles of the disclosed subject matter.

The above-described embodiment describes an instance where the plurality of LED chips 1 is mounted without bonding wires via the bumps due to the use of a flip chip type LED. The number of the bonding wires can be reduced by using the flip chip type LED. However, LED chips having a top electrode and a bottom electrode can also be used as the plurality of LED chips 1. FIG. 9a is a front view showing a second exemplary embodiment of an LED light source made in accordance with principles of the disclosed subject matter, and FIG. 9b is a cross-section view showing a cross-section taken along line A-A of the second embodiment shown in FIG. 9a.

Figure 9B:
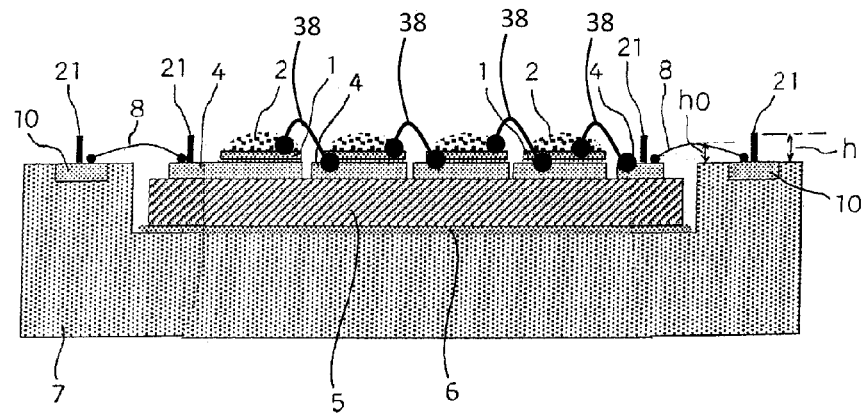

Each of a plurality of LED chips 1 shown in FIGS. 9a and 9b can include the bottom electrode and the top electrode, and can be mounted on the conductor patterns 4 via the bottom electrode and also each of the bottom electrodes can be electrically connected to each of the conductor patterns 4. Each of the top electrodes of the LED chips 1 can be electrically connected to the respective adjacent conductor pattern 4 via second bonding wires 38.

Figure 10A:
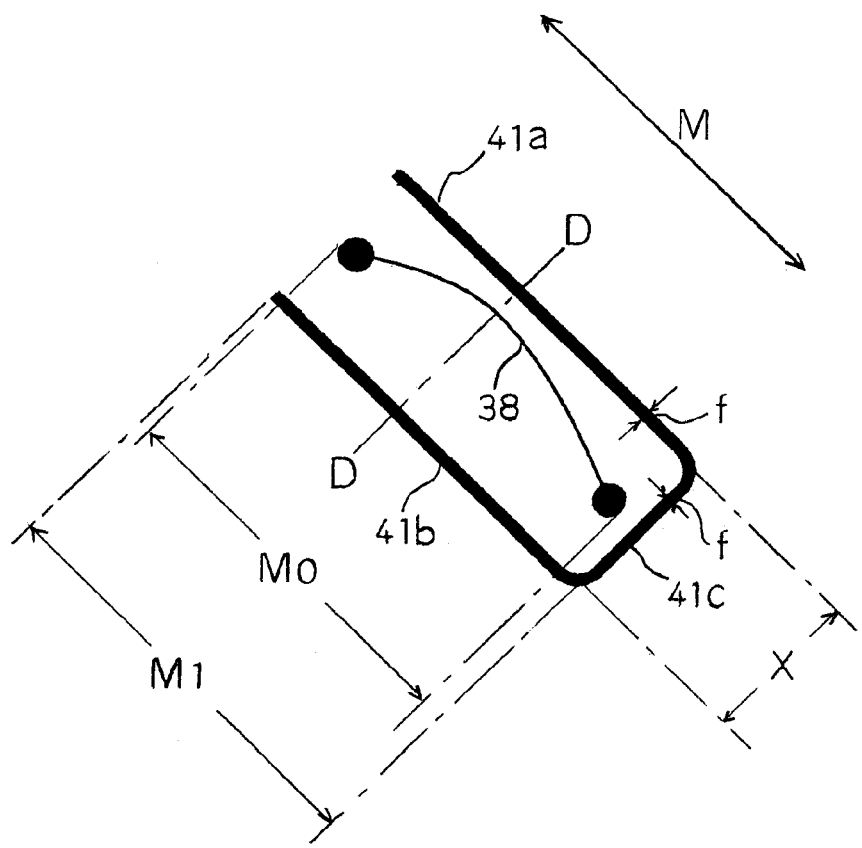
Figure 10B:
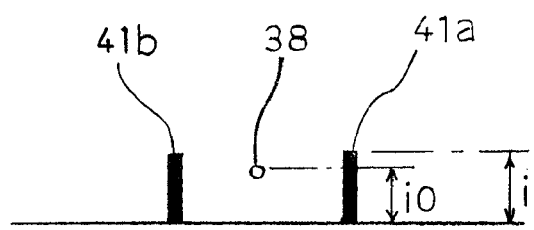

As the second bonding wires 38, a gold-bonding wire having a diameter of 20 to 30 micrometer can be used. In the second embodiment shown in FIG. 9a, the LED light source can include second protection members 41 for protecting the second bonding wires 38 from the external pressure so as to surround the second bonding wires 38. FIG. 10a is close-up view depicting the second protection member 41 of the second embodiment shown in FIG. 9a, and FIG. 10b is a cross-section view showing a cross-section taken along line D-D of the second protection member 41 shown FIG. 10a.

The second protection member 41 can be formed in a substantially U-shape so as to surround the second bonding wire 38. That is, the second protection member 41 can include longitudinal portions 41a and 41b, which are located in an extending direction M of the second bonding wire 38, and short portion 41c which is located in a direction perpendicular to the extending direction M of the second bonding wire 38.

Here, the longitudinal portions 41a and 41b of the second protection member 41 may not be included on the LED chip 1. A width between the longitudinal portions 41a and 41b, that is, a length X of the short portion 41c can be approximately 200 micrometers. A wiring width f of the second protection member 41 can be 0.05 to 0.1 millimeters. A height i of the second protection member 41 can be higher than a maximum height i0 of the second bonding wire 38, and thereby the second protection member 41 can protect the second bonding wire 38 from external pressure. In addition, even if the second bonding wire 38 is pressed from a top direction thereof by the external pressure, the second bonding wire 38 can be pressed only toward the conductor pattern 4, and therefore cannot come down.

A resin such as a transparent silicone resin, a transparent epoxy resin and the like can be used as the second protection member 41. A white resin can be used in place of the transparent resin. For example, a white resin in which a filler such as titanium oxide and the like is/are mixed with the transparent epoxy resin or the transparent silicone resin at a rate of 5 to 20 weight percentage can be used as the second protection member 41.

When the LED light source emits an upward light that may give a glaring type light to an oncoming car and the like due to the second protection member 41, which is made of the transparent resin or the white resin, the upward directed light may be reduced by using a black resin. A black resin that mixes a filler such as carbon and the like with the transparent epoxy resin or the transparent silicone resin can be used as the second protection member 41.

In addition, a ceramic ring can also be used as the second protection member 41 in place of the above-described resins. When a ceramic ring is used as the second protection member 41, the ceramic ring can be attached to the conductor pattern 4 of the sub mount substrate 5 via an adhesive material such as a silicon resin, an epoxy resin, etc. A manufacturing method for the second protection member 41 will now be described.

A transparent resin (e.g. a silicone having a viscosity of 150 Pa·s) is poured in the dispenser (e.g. dispenser made by Musashi engineering Co., Ltd.). A nozzle of the dispenser can move at a prescribed applying speed toward the conductor pattern 4 of the sub mount substrate 5 while it disposes the resin at the predetermined wiring wide f and the height i on the conductor pattern 4.

More specifically, when a diameter of the nozzle is 0.04 millimeters, the applying speed can be 5 millimeters/second, a discharge pressure can be 150 KPa, and a gap between the nozzle and an applying surface can be 0.1 millimeters, the second protection member 41 having the wiring width f of 0.2 millimeters and the height i of 0.2 millimeters that is the same as the maximum height i0 of the second bonding wire 38 can be applied on the conductor pattern 4 of the sub mount substrate 5. After that, the second protection member 21 can be solidified for over four hours at 150 degrees centigrade.

In the above-described manufacturing method, the wiring width f of the second protection member 41 can be adjusted by changing the diameter of the nozzle of the dispenser 50, the applying speed, the discharge pressure, the gap and the viscosity of the resin. When the applying speed increases, the wiring width f of the second protection member 41 can become narrow. When the discharge pressure decreases and when the gap between the nozzle and the applying surface is reduced, the wiring width f of the second protection member 41 can become narrow. The wiring width f can be adjusted within the range of 40 micrometers to 3 millimeters.

Moreover, the height i of the second protection member 41 can be adjusted by changing the applying speed of the dispenser 50, the discharge pressure, the gap between the nozzle and the applying surface and the viscosity of the resin. For example, when the applying speed decreases, the height f of the second protection member 41 can become higher. When the applying speed increases, the height f of the second protection member 41 can become lower.

In this case, when the height i of the second protection member 41 is shorter than the wiring width f of the second protection member 41, the height i can be adjusted by changing the applying speed, the discharge pressure and the gap. When the height i is longer than the wiring width f, the resin having the height i can be applied by a multi-layer structure. Although the height i of the second protection member 41 may become high by the multi-layer structure, the decrease of the light flux is not caused if the height i of the second protection member 41 is lower than the height of the phosphor resin 2.

When the second protection member 41 on the conductor pattern 4 is formed in the same level as a lower other portion not including the conductor pattern 4, the height of the second protection member 41 on the conductor pattern 4 can be adjusted by decreasing the applying speed at the lower other portion. The height i of the second protection member 41 can be adjusted within the range of 40 micrometers to 3 millimeters. In the above-described second embodiment, the height i should be formed between 0.2 to 0.5 millimeters, so as to keep at a higher position than the maximum height i0 of the second bonding wire 38 and at a lower position than the height of the phosphor resin 2.

In the second embodiment shown in FIGS. 9a and 9b, when a width between the adjacent conductor patterns is narrow, the second protection member 41 can be easily formed in the substantially same level on the conductor pattern 4 and the sub mount substrate 5. However, if the width between the adjacent conductor patterns 4 is wide, the second protection member 41 may hollow between the adjacent conductor patterns 4. In the case, the second protection member 41 can also be formed in the substantially same level on the conductor patterns 4 and the sub mount substrate 5 with filling the patching resin on the sub mount substrate 5 between the adjacent conductor patterns 4 as described in FIG. 5c.

Figure 11A:
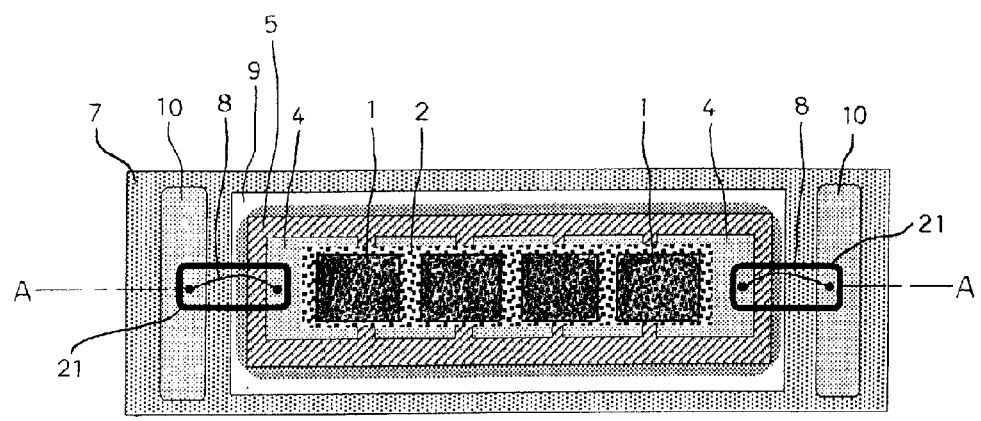
FIG. 11a is a front view showing a third exemplary embodiment of an LED light source made in accordance with principles of the disclosed subject matter.
Figure 11B:
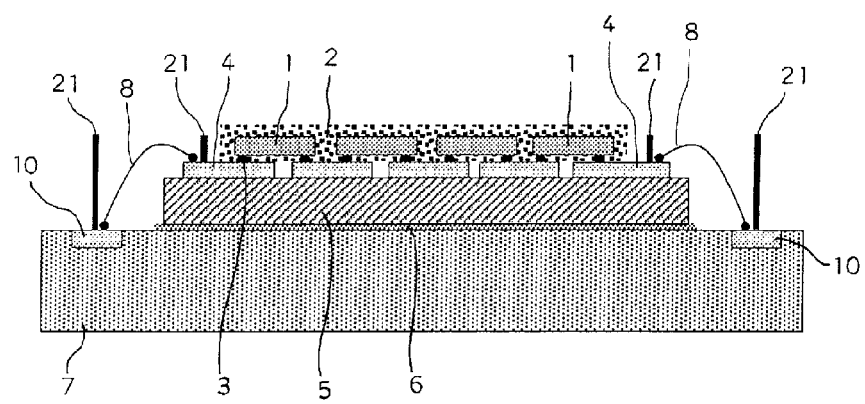

In the above-described first and second embodiments, the substrate 7 can include the cavity 9. However, the substrate 7 may not necessarily include the cavity 9 and can be formed in a flat surface. FIG. 11a is a front view showing a third exemplary embodiment of an LED light source made in accordance with principles of the disclosed subject matter, and FIG. 11b is a cross-section view showing a cross-section taken along line A-A of the third embodiment shown in FIG. 11a.

The sub mount substrate 5 can be mounted on a flat surface of the substrate 7, which is formed in a substantially plate shape. In this case, because a differential height between the conductor pattern 4 of the sub mount substrate 5 and the electrode pattern 10 of the substrate 7 may occur, the protection member 21 must be formed while the differential height is considered. More specifically, the height h of the protection member 21 should be formed in a higher shape than the maximum height h0 of the first bonding wire 8 and should be formed in a lower shape than the height of the phosphor resin 2.

Therefore, the protection member 21 can be formed at a higher height on the substrate 5 than a height on the conductor pattern 4 and the sub mount substrate 5 by the above-described method. Specifically, when the protection member 21 is formed by a normal condition, the differential height may occur between the conductor pattern 4 and the substrate 7 as shown FIG. 12a.

Figure 12A:
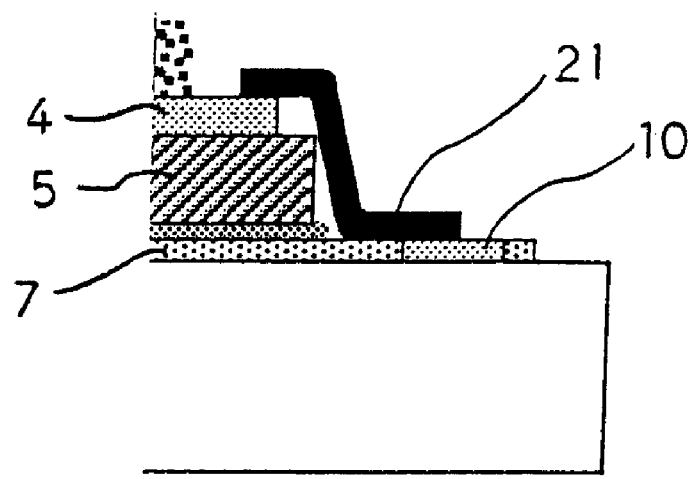
FIGS. 12a and 12b are explanatory diagrams of a manufacturing method for the first protection member shown in FIGS. 11a and 11b.
Figure 12B:
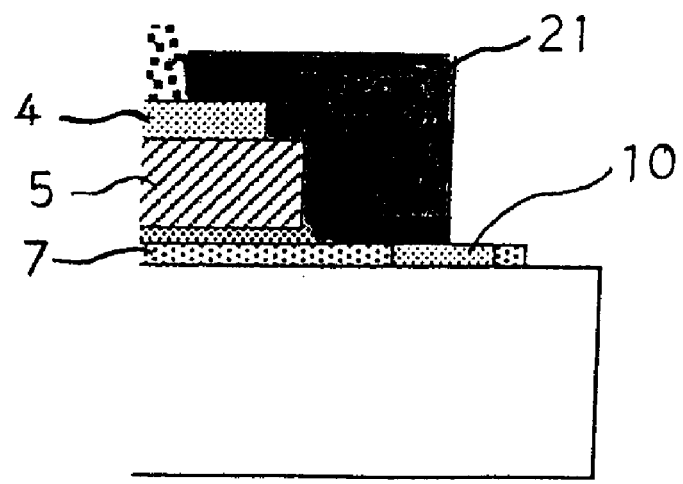
Figure 13:
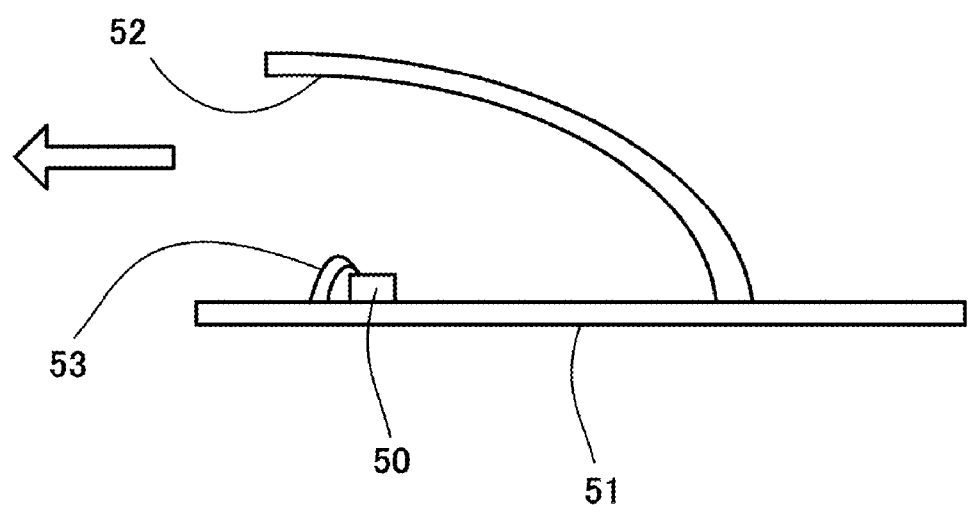
Figure 14:
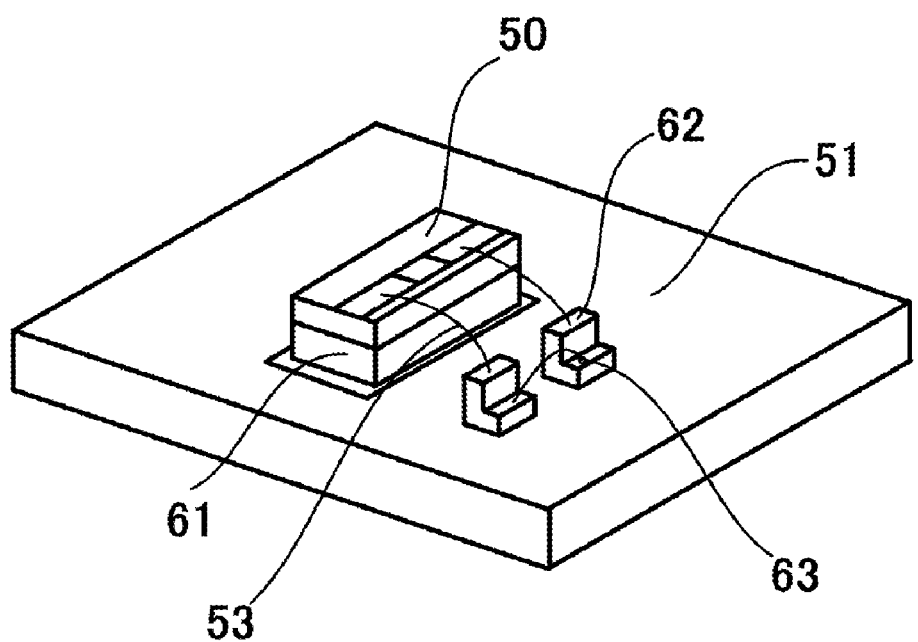
FIG. 14 is a perspective view showing another conventional LED light source using a sub mount substrate.

By decreasing the applying speed in order of the substrate 7, the sub mount substrate 5 and the conductor pattern 4 or by applying the resin on the substrate 7 up to the sub mount substrate 5, applying the resin on the sub mount substrate 5 and the resin on the substrate 7 up to the conductor pattern 4 and applying the resin on the conductor pattern 4 and the resin on the sub mount substrate 5 and the substrate 7, the protection member 21 can be formed in the substantially same level with reference to the substrate 7 as shown in FIG. 12b.

As described above, the LED light source of the disclosed subject matter can include the first protection member 21 and the second protection member 41 to protect the first and second bonding wires 8 and 38 from the external pressure. Each of the first and second protection members 21 and 41 can include at least longitudinal portions 21a, 21b and 41a, 41b along each extending direction of the first and second bonding wires 8 and 38, and each height of the first and second protection members 21 and 41 can be higher than each of the maximum heights h0 and i0 of the first and second bonding wires 8 and 38 and can be lower than the height of the phosphor resin 2.

Thus, the reduction of the light flux cannot be caused because the protection members 21 and 41 do not cover the LED chips 1 unlike the conventional structures including a dome-shaped lens. In addition, the first and second bonding wires 8 and 38 cannot come down unlike the conventional structure including an encapsulating resin even if they receive a heat shock cycle along with the protection members 21 and 41. Furthermore, the protection members 21 and 41 can protect the first and second bonding wires 8 and 38 from the external pressure using the substantially same efficiency as the conventional structure including the dome-shaped lens. Thus, the disclosed subject matter can provide reliable LED light sources having a favorable light distribution.

Various modifications of the above disclosed embodiments can be made without departing from the spirit and scope of the presently disclosed subject matter. For example, cases where the protection member 21 is formed in the substantially rectangular shape and in the longitudinal portions 21a and 21b in parallel are described. However, the protection member 21 cannot be limited to their shapes and can be formed in various shapes such as a U-shape and the like if the height thereof is between the maximum height of the bonding wire and the height of the phosphor resin.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A light emitting diode (LED) light source, comprising:
    a substrate including a plurality of isolated electrode patterns, the electrode patterns exposed from the substrate;
    a sub mount substrate having a plate shape, the sub mount substrate located over the substrate and located adjacent to the electrode patterns of the substrate, the sub mount substrate including a plurality of conductor patterns on a surface opposite the substrate;
    at least one flip type LED chip having bottom electrodes mounted on the conductor patterns of the sub mount substrate, each of the bottom electrodes being electrically connected to each of the conductor patterns;
    a phosphor resin having a height with reference to the electrode patterns of the substrate and covering the at least one flip type LED chip;
    bonding wires each having a maximum height with reference to the electrode patterns of the substrate, the bonding wires electrically connecting each of the electrode patterns of the substrate and respective conductor patterns that are located adjacent to each of the electrode patterns; and
    protection members having a height with reference to the electrode patterns of the substrate and located along an extending direction of the bonding wires so as to surround at least two sides of each extending direction of the bonding wires, and wherein each height of the protection members is higher than each maximum height of the bonding wires and is lower than the height of the phosphor resin.

2. The LED light source according to claim 1, wherein each of the protection members includes one of a silicon resin, an epoxy resin and a ceramic.

3. The LED light source according to claim 1, wherein each of the protection members is formed in a substantially rectangular shape as viewed from a front of the LED light source.

4. The LED light source according to claim 1, wherein the at least one flip type LED chip is a blue LED chip and the phosphor resin includes a yellow phosphor.

5. A method for manufacturing the LED light source according to claim 1, comprising:
    preparing the substrate including the electrode patterns and the sub mount substrate including the at least one flip LED chip;
    mounting the sub mount substrate on the substrate;
    bonding between each of the electrode patterns of the substrate and the respective conductor patterns that are located adjacent to each of the electrode patterns via the bonding wires; and
    forming the protection members along each extending direction of the bonding wires so as to surround at least both sides of each extending direction of the bonding wires.

6. The LED light source according to claim 1, wherein the substrate includes a cavity having a substantially flat bottom surface and wherein the sub mount substrate is mounted on the bottom surface of the substrate.

7. The LED light source according to claim 6, wherein each of the protection members includes one of a silicon resin, an epoxy resin and a ceramic.

8. The LED light source according to claim 6, wherein each of the protection members is formed in a substantially rectangular shape as viewed from a front of the LED light source.

9. The LED light source according to claim 6, wherein the at least one flip type LED chip is a blue LED chip and the phosphor resin includes a yellow phosphor.

10. A method for manufacturing the LED light source according to claim 6, comprising:
preparing the substrate including the electrode patterns and the cavity and the sub mount substrate including the at least one flip LED chip;
mounting the sub mount substrate in the cavity of the substrate;
bonding between each of the electrode patterns of the substrate and the respective conductor patterns that are located adjacent to each of the electrode patterns via the bonding wires; and
forming the protection members along each of the extending directions of the bonding wires so as to surround at least both sides of each extending direction of the bonding wires.

11. A light emitting diode (LED) light source, comprising:
a substrate including a plurality of isolated electrode patterns, the electrode patterns exposed from the substrate;
a sub mount substrate having a plate shape, the sub mount surface located over the substrate and located adjacent to the electrode patterns of the substrate, the sub mount substrate including a plurality of conductor patterns on a surface opposite the substrate;
at least one LED chip having a top electrode and a bottom electrode mounted on one of the conductor patterns of the sub mount substrate using the bottom electrode, the bottom electrode being electrically connected to the one of the conductor patterns, and the top electrode being electrically connected to another of the conductor patterns via a second bonding wire having a maximum height with reference to the electrode patterns of the substrate so that the at least one LED chip is connected in series between the conductor patterns;
a phosphor resin having a height with reference to the electrode patterns of the substrate and covering the at least one flip type LED chip;
first bonding wires each having a maximum height with reference to the electrode patterns of the substrate, one of the first bonding wires being electrically connected between the one of the conductor patterns and one of the electrode patterns of the substrate that is located adjacent to the one of the conductor patterns, and another of the first bonding wires being electrically connected between the another of the conductor patterns and another of the electrode patterns of the substrate;
first protection members each having a height with reference to the electrode patterns of the substrate and located along extending directions of the first bonding wires so as to surround at least both sides of each extending direction of the first bonding wires, and wherein each height of the first protection members is higher than each maximum height of the first bonding wires and is lower than the height of the phosphor resin; and
at least one second protection member having a height with reference to the electrode patterns of the substrate and located along an extending direction of the second bonding wire so as to surround at least both sides of the extending direction of the second bonding wire, and wherein the height of the at least one second protection member is higher than the maximum height of the second bonding wire and is lower than the height of the phosphor resin.

12. The LED light source according to claim 11, wherein each of the first protection members and the at least one second protection member include one of a silicon resin, an epoxy resin and a ceramic.

13. The LED light source according to claim 11, wherein each of the first protection members is formed in a substantially rectangular shape as viewed from a front of the LED light source, and the at least one second protection member is formed in a substantially U-shape.

14. The LED light source according to claim 11, wherein the at least one LED chip is a blue LED chip and the phosphor resin includes a yellow phosphor.

15. A method for manufacturing the LED light source according to claim 11, comprising:
preparing the substrate including the electrode patterns, the sub mount substrate including the plurality of conductor patterns and the at least one LED chip having the top electrode and the bottom electrode;
mounting the at least one LED chip on the one of the conductor patterns of the sub mount substrate using the bottom electrode of the at least one LED chip;
bonding between the top electrode of the at least one LED chip and the another of the conductor patterns of the sub mount substrate via the second bonding wire;
forming the at least one second protection member along the extending direction of the second bonding wire so as to surround at least both sides of the extending direction of the second bonding wire;
mounting the sub mount substrate on the substrate;
bonding between the one of the conductor patterns of the sub mount substrate and the one of the electrode patterns of the substrate and between the another of the conductor patterns of the sub mount substrate and the another of the electrode patterns of the substrate via the first bonding wires; and
forming the first protection members along each of the extending directions of the first bonding wires so as to surround the at least both sides of each extending direction of the first bonding wires.

16. The LED light source according to claim 11, wherein the substrate includes a cavity having a substantially flat bottom surface and wherein the sub mount substrate is mounted on the bottom surface of the substrate.

17. The LED light source according to claim 16, wherein each of the first protection members and the at least one second protection member include one of a silicon resin, an epoxy resin and a ceramic.

18. The LED light source according to claim 16, wherein each of the first protection members is formed in a substantially rectangular shape as viewed from a front of the LED light source, and the at least one second protection member is formed in a substantially U-shape.

19. The LED light source according to claim 16, wherein the at least one LED chip is a blue LED chip and the phosphor resin includes a yellow phosphor.

20. A method for manufacturing the LED light source according to claim 16, comprising:
preparing the substrate including the electrode patterns and cavity, the sub mount substrate including the plurality of conductor patterns and the at least one LED chip having the top electrode and the bottom electrode;
mounting the at least one LED chip on the one of the conductor patterns of the sub mount substrate using the bottom electrode of the at least one LED chip;
bonding between the top electrode of the at least one LED chip and the other one of the conductor patterns of the sub mount substrate via the second bonding wire;
forming the at least one second protection member along the extending direction of the second bonding wire so as to surround at least both sides of the extending direction of the second bonding wire;

mounting the sub mount substrate in the cavity of the substrate;

bonding between the one of the conductor patterns of the sub mount substrate and the one of the electrode patterns of the substrate and between the another of the conductor patterns of the sub mount substrate and the another of the electrode patterns of the substrate via the first bonding wires; and forming the first protection members along each of the extending directions of the first bonding wires so as to surround the at least both sides of each extending direction of the first bonding wires.

* * * * *